(12) United States Patent
Doi

(10) Patent No.: US 7,829,470 B2
(45) Date of Patent: Nov. 9, 2010

(54) METHOD FOR MANUFACTURING SEMICONDUCTOR DEVICE

(75) Inventor: Tomohiko Doi, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/320,827

(22) Filed: Feb. 5, 2009

(65) Prior Publication Data
US 2009/0203207 A1    Aug. 13, 2009

(30) Foreign Application Priority Data
Feb. 12, 2008    (JP) .............................. 2008-030512

(51) Int. Cl.
*H01L 21/302* (2006.01)

(52) U.S. Cl. ................ 438/714; 438/706; 438/707; 438/710; 438/712

(58) Field of Classification Search ................ 438/706, 438/707, 710, 712, 714
See application file for complete search history.

(56) References Cited

U.S. PATENT DOCUMENTS 6,057,247 A * 5/2000 Imai et al. .................... 438/714
6,235,640 B1 * 5/2001 Ebel et al. .................... 438/706
6,376,384 B1 * 4/2002 Yen et al. ..................... 438/706
2006/0079095 A1 * 4/2006 McReynolds et al. ....... 438/725
2006/0089003 A1 * 4/2006 Cheng et al. ................. 438/706
2008/0153307 A1 * 6/2008 Yamada et al. .............. 438/745

FOREIGN PATENT DOCUMENTS

| JP | 9-162172 | 6/1997 |
|----|----------|--------|
| JP | 11-145111 | 5/1999 |
| JP | 11-345874 | 12/1999 |

* cited by examiner

*Primary Examiner*—Kevin M Picardat
*Assistant Examiner*—Bac H Au
(74) *Attorney, Agent, or Firm*—McGinn IP Law Group, PLLC

(57) ABSTRACT

A contact hole, after hole etching, is subjected to light etching using a process gas containing a fluorocarbon-based gas and oxygen, with the oxygen being enriched, under condition without applying bias. Then, reaction products (5) having C—F bond and adhered to an interior of a hole (3) are removed using plasma treatment. After that, deposits (4) that have been left at a hole bottom are removed by wet processing. Then, a conductive material is buried in the hole to form a contact plug (7).

11 Claims, 2 Drawing Sheets

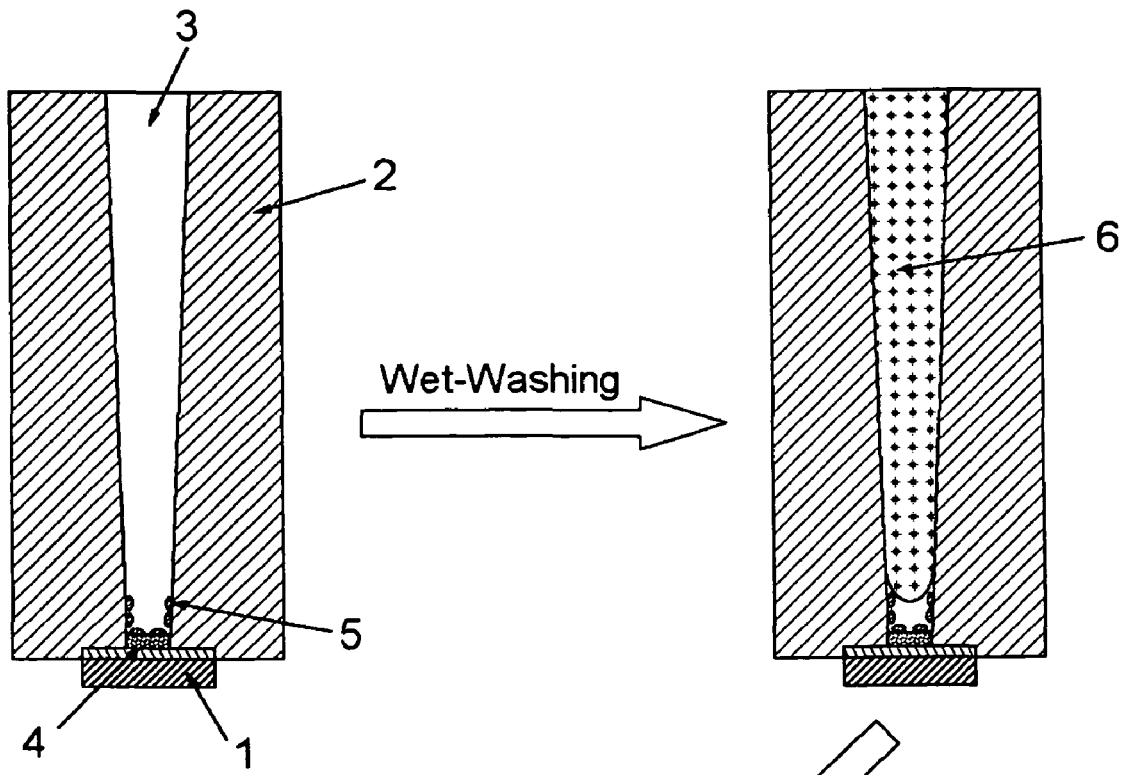
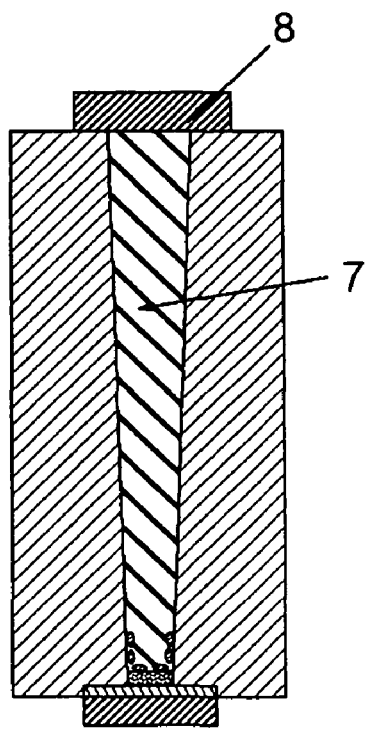
FIG. 1(a)
FIG. 1(b)
FIG. 1(c)

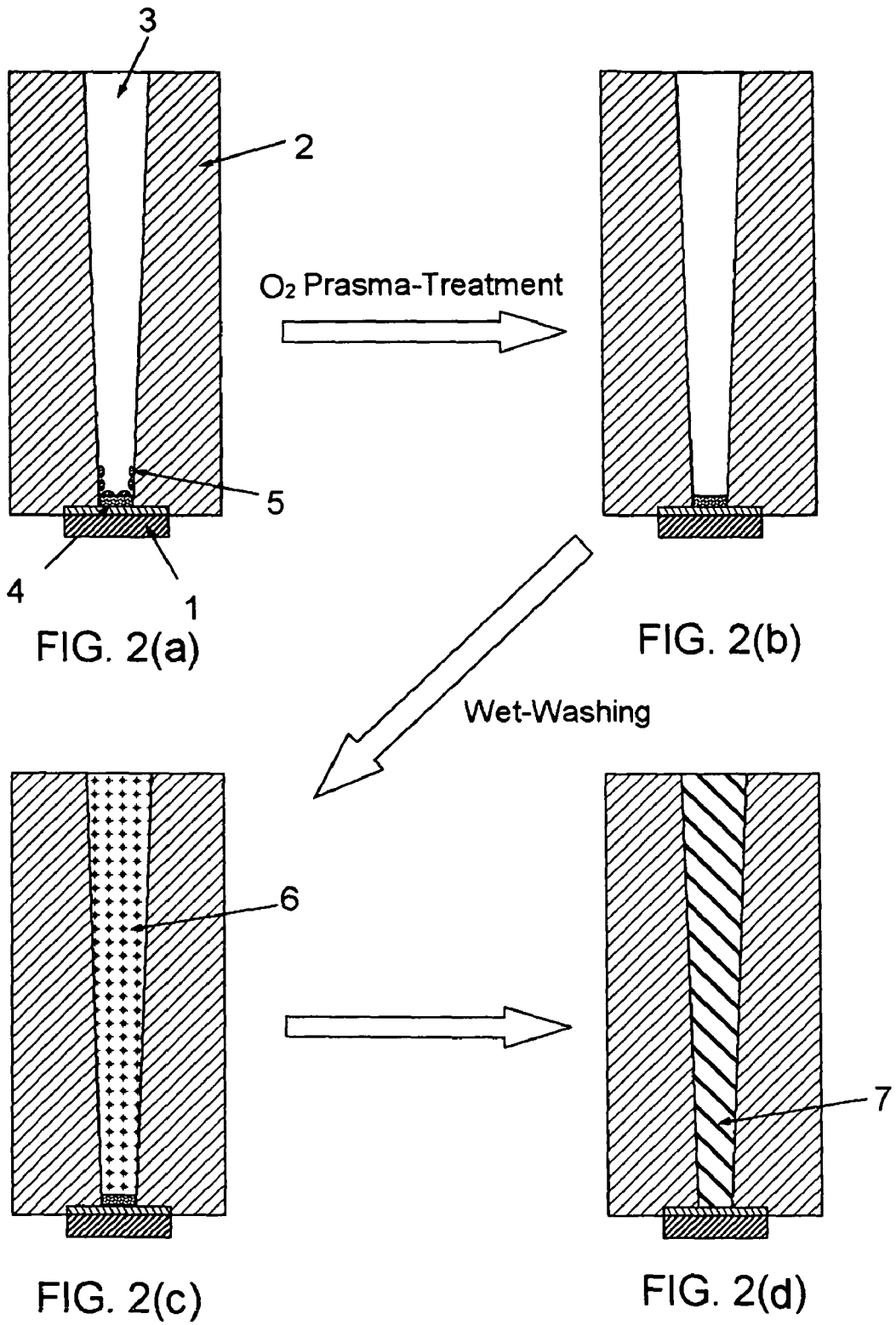

METHOD FOR MANUFACTURING SEMICONDUCTOR DEVICE

BACKGROUND OF THE INVENTION

1. Field of the Invention

The present invention relates to a method for manufacturing a semiconductor device, and in particular to removal of residue in forming a hole of high aspect ratio.

2. Description of Related Art

With the recent demand for high integration, downsizing of semiconductor devices is more and more accelerated. Accordingly, there has also been a demand for reducing the dimensions such as of contact holes. However, an interlayer insulating film forming a contact hole is required to have a certain degree of thickness because of the necessity of mitigating parasitic resistance, for example. As a result, contact holes have been required to be etched in such a way that a high aspect ratio (in particular, an aspect ratio of 10 or more) can be imparted thereto.

In the case of a silicon oxide film, which is a generally used interlayer insulating film, dry etching is performed using a fluorocarbon gas containing a small ratio of fluorine relative to carbon in a molecule, in order to form a contact hole having a high aspect ratio.

In performing such etching using a fluorocarbon-based gas under the condition of raising etching selection ratio for photoresist, a polymer film that contains carbon and fluorine as main components may be deposited on the bottom of the contact hole. It is known that such a polymer film can be removed using oxygen plasma.

Japanese Patent Laid-Open No. 11-145111 describes that contact resistance is recognized as being increased when such a polymer film is removed using oxygen plasma. In order to resolve this problem, a method has been suggested, which successively carries out a plasma etching process using a fluorocarbon-based gas and an oxygen plasma treatment process. In particular, this method includes applying bias voltage to the substrate during the plasma etching process using a fluorocarbon-based gas, and causing oxygen plasma without applying bias voltage to the substrate when the plasma etching process is switched to the oxygen plasma treatment process, thereby removing fluorine from the reaction chamber.

On the other hand, it is known that, in manufacturing a high-aspect hole, light etching is performed to remove damaged layers and etching residue (so-called "deposits") after opening a hole. For example, Japanese Patent Laid-Open No. 09-162172 discloses a method for removing damaged portions formed in a base silicon layer. Specifically, in forming a contact hole in an interlayer insulating film, the method includes introducing into a chamber a process gas comprising $CF_4+O_2$ with a $CF_4$ gas content of 60 to 80% by volume with a predetermined introduction pressure and flow rate, and applying high-frequency power to the introduced gas to have plasma produced for removal of the damaged portions. In this way, a side-etching amount of a contact hole is considered to be minimized by specifying the introduction ratio, introduction pressure and flow rate of $CF_4$ gas.

Use of a fluorocarbon-based gas, such as $CF_4$ gas, in performing such light etching may partially remove deposits, however, may not completely remove the deposits. In addition, use of a fluorocarbon-based gas in performing light etching produces reaction products including carbon (C) and fluorine (F) with C—F bond (polytetrafluoroethylene-based material: $(-CF_2CF_2-)_n$).

Being different from such light etching, Japanese Patent Laid-Open No. 11-345874 describes that, in etching an oxide film using a resist mask, carbon atoms in the resist undergo reaction with fluorine radicals in the process gas to permit adhesion of a similar polytetrafluoroethylene-based material onto the sidewall of the hole. This reference further describes that, for the removal of the adherents, $O_2$ plasma treatment is combined with a chemical washing process.

In order to raise the removal rate of the residual deposits after light etching, wet processing using a wash solution may be performed. However, the reaction products with C—F bond that have been produced after light etching are hydrophobic. Accordingly, adhesion of such reaction products in the hole may resultantly block the entry of a wet washing solution during post treatment. This tendency is particularly prominent in the holes having a high aspect ratio.

FIGS. 1(a) to 1(c) are process cross-sectional views illustrating procedures of wet washing after light etching, and of burying a contact plug after the washing. These figures illustrate a case where a contact is formed between a bit line and upper wiring.

As shown in FIG. 1(a), after light etching, contact hole 3 is formed in interlayer insulating film 2 on bit line 1, and residual deposits 4 and reaction products 5 with C—F bond are adhered to the bottom of contact hole 3. If wet processing is performed in this state using wash solution 6, such as a solution of dilute hydrofluoric acid (DHF), wash solution 6 will not reach the bottom of the contact hole, as shown in FIG. 1(b), because reaction products 5 are hydrophobic, thereby disabling removal of deposits 4.

In this way, in the state where washing has not been sufficiently performed, a conductive material is buried, with deposits 4 being left in hole 3. This may resultantly raise a problem of high resistance by which the characteristics of the semiconductor device will be deteriorated.

SUMMARY

As a result of intensive study for resolving the problem provided above, the inventors of the present invention have found that the combination of light etching with wet processing that follows the light etching, can enhance the efficiency of removing the deposits.

Specifically, in an embodiment, a method for manufacturing a semiconductor device is provided, which comprises:

forming an interlayer insulating film on a substrate which is formed with a lower conductor;

forming a contact hole in the interlayer insulating film;

performing light etching in the contact hole, using a process gas containing a fluorocarbon-based gas and oxygen, with the oxygen being enriched, under condition without applying bias;

performing oxygen plasma treatment after purging the process gas;

washing an interior of the contact hole using a wash solution; and after drying, forming a contact plug by burying a conductor in the contact hole.

According to the embodiment, isotropic light etching using an oxygen enriched process gas without applying bias, is combined with wet processing to enhance the efficiency of removing residual deposits in a contact hole. Also, according to the exemplary embodiment, plasma treatment is performed prior to the wet processing, to enable removal of reaction products having C—F bond, which have been produced by the light etching. Thus, a wash solution used during the wet processing can reach the bottom of the contact hole to remove the remaining deposits. As a result, contact resistance caused by the remaining deposits, can be prevented from being increased.

BRIEF DESCRIPTION OF THE DRAWINGS

The above features and advantages of the present invention will be more apparent from the following description of certain preferred embodiments taken in conjunction with the accompanying drawings, in which:

FIGS. 1(a) to 1(c) are process cross-sectional views illustrating problem of the present invention; and FIGS. 2(a) to 2(d) are process cross-sectional views illustrating a manufacturing method of the present invention.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

An exemplary embodiment will hereinafter be described in detail with reference to the drawings.

FIGS. 2(a) to 2(d) are process cross-sectional views illustrating the exemplary embodiment.

First, interlayer insulating film 2 is formed on a substrate which is formed with lower conductor 1. As lower conductor 1, a bit line (tungsten wiring) used for a DRAM, for example, is exemplified here. This, however, is not intended to make a limitation, but aluminum wiring or copper wiring may alternatively be used. Interlayer insulating film 2 (silicon oxide film) may be formed using a plasma CVD process, for example, in which TEOS (Tetra Ethylene Ortho Silicate) is used as a raw material. Then, contact hole 3 having an aspect ratio of 10 or more is formed using an ordinary photolithographic technique and a dry etching technique. For example, interlayer insulating film 2 may have a thickness of 1.5 μm to form a hole having an opening diameter of 120 nm. Dry etching conditions may be selected to include: use of $CF_4$ gas; pressure of 1 to 2 Pa; and high-frequency bias power of 50 to 200 W. Also, in forming a hole having a high aspect ratio, a hard mask may be used to perform hard mask etching with a resist mask, followed by forming a sidewall at an opening formed by the hard mask to reduce the diameter of the opening.

Then, light etching is performed. The light etching is required for removing damaged layers and deposits after opening a contact hole. For example, as conditions for the light etching, gases to be used may be $CF_4$ and $O_2$ without applying bias. What is important here is that, in light etching, an etching rate is set to be an extremely low level, unlike anisotropic etching performed in forming ordinary patterns. In particular, since a lower flow ratio of $CF_4$ can make the etching rate lower, the flow ratio of a fluorocarbon-based gas to oxygen is set in the present invention to a value that can provide an oxygen enriched condition. The flow ratio of a fluorocarbon-based gas to oxygen may preferably be 1:99 to 1:198. As an example of light etching, the flow ratio of the gas to be used may be about $CF_4:O_2=1:100$ (the flow rate of $CF_4$ may be 18 sccm and that of $O_2$ may be 1800 sccm), the pressure may be 267 Pa (2 Torr) and the time may be 10 seconds. Also, since no bias is applied, etching is isotropically performed in the hole. Further, other fluorocarbon-based gases, such as $CHF_3$ or $C_4F_8$, may be used other than $CF_4$. As have been described in the Description of Related Art, use of a fluorocarbon-based gas in light etching may cause reaction products having C—F bond. Concurrently, however, use of an oxygen-enriched process gas can accelerate decomposition of the reaction products in the light etching and reduce the amount of the products.

In the interior of contact hole 3 after light etching, there exist deposits 4 that have resulted from the etching of the hole and have not been completely removed, and reaction products 5 with C—F bond caused at the time of the light etching (FIG. 2(a)).

Subsequently, $O_2$ plasma treatment is carried out (FIG. 2(b)). This treatment is purposed to remove reaction products 5 caused by $CF_4$ gas and to turn the properties inside contact hole 3 to hydrophilic properties. Here, it is important to purge $CF_4$, in advance, which has remained in the treatment atmosphere, so that only $O_2$ can be used. This is because, if $CF_4$ has not been purged, reaction caused by $CF_4$ gas is accelerated to finally permit reaction products 5 to remain. The conditions of $O_2$ plasma treatment may include: a flow rate of 2400 sccm; a pressure of 200 Pa (1.5 Torr); and time of 30 seconds, without applying bias. Thus, C—F (hydrophobic) bond can be cleaved to thereby turn the properties inside the contact hole to hydrophilic properties. Accordingly, conditions of a flow rate, for example, may only have to be set so as to sufficiently remove reaction products 5 and to turn the properties inside the contact hole to hydrophilic properties. Here, the $O_2$ plasma treatment may preferably be carried out in the same chamber where the light etching has been carried out. If the $O_2$ plasma treatment is carried out in a different chamber after movement from the previous chamber, the wafer will be in contact with the atmospheric air which, in turn, will cause alteration in reaction products 5 to probably disable removal of the reaction products.

After being imparted with hydrophilic properties, contact hole 3 is subjected to washing (wet processing) (FIG. 2(c)). Wash solution 6 may include, but not limited to, dilute hydrofluoric acid solution (DHF solution). Concurrently with washing, contact hole 3 may be applied with ultrasonic waves. The removal effect that will be exerted by the ultrasonic vibration may accelerate the effect of removing deposits 4.

Following washing (wet processing), metal, such as tungsten, is buried in the contact hole using an ordinary burying process of contact hole to thereby form contact plug 7 (FIG. 2(d)).

Upper wiring may be formed on contact plug 7 using a known method.

What is claimed is:

1. A method for manufacturing a semiconductor device, comprising:

forming an interlayer insulating film on a substrate which is formed with a lower conductor;

forming a contact hole in the interlayer insulating film;

performing light etching in the contact hole, using a process gas containing a fluorocarbon-based gas and oxygen, with the oxygen being enriched, under condition without applying bias, a flow ratio between the fluorocarbon-based gas and oxygen in the process gas being in a range from 1:99 to 1:198;

performing oxygen plasma treatment after purging the process gas;

washing an interior of the contact hole using a wash solution; and after drying, forming a contact plug by burying a conductor in the contact hole.

2. The method for manufacturing a semiconductor device according to claim 1, wherein an aspect ratio of the contact hole to be formed is equal to or more than 10.

3. The method for manufacturing a semiconductor device according to claim 1, wherein the light etching and the oxygen plasma treatment are successively performed in the same chamber.

4. The method for manufacturing a semiconductor device according to claim 1, wherein the forming of the contact hole comprises performing hard mask etching using a resist mask.

5. The method for manufacturing a semiconductor device according to claim 1, wherein the performing of the light etching of the contact hole comprises forming a reaction product having a C—F bond in the contact hole, and the performing of the oxygen plasma treatment comprises cleaving the C—F bond to turn a property of the contact hole from a hydrophobic property into a hydrophilic property.

6. The method for manufacturing a semiconductor device according to claim 1, wherein the interlayer insulating film comprises silicon oxide.

7. The method for manufacturing a semiconductor device according to claim 1, wherein the wash solution comprises dilute hydrofluoric acid solution.

8. The method for manufacturing a semiconductor device according to claim 1, further comprising:
applying the contact hole with an ultrasonic wave concurrently with the washing of the interior of the contact hole.

9. The method for manufacturing a semiconductor device according to claim 1, wherein the fluorocarbon-based gas is selected from a group consisting of $CF_4$, $CHF_3$ and $C_4F_8$.

10. The method for manufacturing a semiconductor device according to claim 1, wherein the performing of the light etching comprises in a chamber, performing the light etching by flowing the process gas containing the fluorocarbon-based gas and oxygen into the chamber, with the oxygen being enriched, under condition without applying bias.

11. A method of manufacturing a semiconductor device, comprising:
forming a contact hole in an interlayer insulating film;
performing light etching in the contact hole, using a process gas including a fluorocarbon-based gas and oxygen, with the oxygen being enriched, under condition without applying bias, a flow ratio between the fluorocarbon-based gas and oxygen in the process gas being in a range from 1:99 to 1:198;
purging the process gas from the chamber;
performing oxygen plasma treatment in the purged chamber;
washing an interior of the contact hole using a wash solution; and
after drying, forming a contact plug by burying a conductor in the contact hole.

* * * * *